United States Patent
Shin et al.

(10) Patent No.: US 7,123,633 B2
(45) Date of Patent: Oct. 17, 2006

(54) METHOD FOR MAINTAINING MODE-LOCKED STATE OF FABRY-PEROT LASER IRRESPECTIVE OF TEMPERATURE CHANGE AND WDM LIGHT SOURCE USING THE SAME METHOD

(75) Inventors: Dong-Jae Shin, Suwon-shi (KR); Dae-Kwang Jung, Suwon-shi (KR); Jea-Hyuck Lee, Anyang-shi (KR); Seong-Taek Hwang, Pyongtaek-shi (KR); Yun-Je Oh, Yongin-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 319 days.

(21) Appl. No.: 10/691,392

(22) Filed: Oct. 22, 2003

(65) Prior Publication Data
US 2004/0184805 A1 Sep. 23, 2004

(30) Foreign Application Priority Data
Mar. 5, 2003 (KR) .................. 10-2003-0013574

(51) Int. Cl.
*H01S 3/098* (2006.01)
*H04J 14/02* (2006.01)
(52) U.S. Cl. .......................... 372/18; 398/79
(58) Field of Classification Search ............. 372/18, 372/29.01, 29.02, 29.022
See application file for complete search history.

(56) References Cited

U.S. PATENT DOCUMENTS

| 6,381,047 | B1 * | 4/2002 | Frigo et al. ................... 398/79 |
| 6,393,168 | B1 * | 5/2002 | Atoji et al. ................... 385/11 |
| 6,614,822 | B1 * | 9/2003 | Yoshida et al. ........... 372/45.01 |
| 6,680,960 | B1 * | 1/2004 | Yoshida et al. ........... 372/50.11 |
| 6,760,352 | B1 * | 7/2004 | Wakisaka et al. ............ 372/36 |
| 2001/0004290 | A1 * | 6/2001 | Lee et al. ................... 359/124 |
| 2001/0026565 | A1 * | 10/2001 | Takeshita et al. ........ 372/38.02 |
| 2004/0184491 | A1 * | 9/2004 | Wai et al. ..................... 372/27 |
| 2004/0213574 | A1 * | 10/2004 | Han et al. ..................... 398/71 |

* cited by examiner

*Primary Examiner*—James Menefee
*Assistant Examiner*—Phillip Nguyen
(74) *Attorney, Agent, or Firm*—Cha & Reiter, LLC

(57) ABSTRACT

A method for maintaining the mode-locked state of a Fabry-Perot (FP) laser and a WDM light source using the same method for use in WDM optical communication are disclosed. The mode-locked state can be maintained irrespective of temperature change, without use of a temperature controller, by spectrum-slicing the incoherent light generated by a light source element and injecting the spectrum-sliced light to the FP laser, then the FP laser amplifies and outputs only a lasing mode coinciding with the wavelength of the injected light, wherein a lasing-mode interval of the FP laser is set to be less than a 3 dB linewidth of the injected light, so that at least one lasing mode exists inside the 3 dB linewidth of the injected light irrespective of changes in external temperature.

13 Claims, 5 Drawing Sheets

METHOD FOR MAINTAINING MODE-LOCKED STATE OF FABRY-PEROT LASER IRRESPECTIVE OF TEMPERATURE CHANGE AND WDM LIGHT SOURCE USING THE SAME METHOD

CLAIM OF PRIORITY

This application claims priority to an application entitled "METHOD FOR MAINTAINING MODE-LOCKED STATE OF FABRY-PEROT LASER IRRESPECTIVE OF TEMPERATURE CHANGE AND WDM LIGHT SOURCE USING THE SAME METHOD," filed in the Korean Intellectual Property Office on Mar. 5, 2003 and assigned Ser. No. 2003-13574, the contents of which are hereby incorporated by reference.

BACKGROUND OF THE INVENTION

1. Field of the Invention

The present invention relates to Wavelength Division Multiplexing (WDM) optical communications and, more particularly, to a method for maintaining the mode-locked state of a Fabry-Perot laser irrespective of the changes in peripheral temperature, and a WDM light source incorporating the same method.

2. Description of the Related Art

A WDM passive optical network (PON) generally provides high-speed, wideband communication services using unique wavelengths assigned to each subscriber. As such, the WDM-PON can secure communication confidentiality. Further, it can accommodate a communication-capacity extension requested by each subscriber and easily extend the number of subscribers by simply adding unique wavelengths to be assigned to the new subscribers. Despite these advantages, the WDM-PON has not yet been put to practical use as it imposes a heavy economic burden on subscribers due to the need to provide a central office (CO) and each subscriber terminal with a light source of a specific lasing or oscillation wavelength as well as an additional wavelength-stabilization circuit for stabilizing the wavelength of the light source.

Accordingly, the development of an economical WDM light source is essential to realize the WDM-PON. To this end, a distributed feedback (DFB) laser array, a multi-frequency laser (MFL), a spectrum-sliced light source, and a mode-locked Fabry-Perot (FP) laser with incoherent light have been proposed. However, the DFB laser array and the MFL require a complicated manufacturing process and are costly. In addition, a wavelength stabilization and a correct wavelength selection of the light source are essential to implement the wavelength division multiplexing. Recently, the spectrum-sliced light source has been developed to provide a number of wavelength-divided channels by spectrum-slicing a broad-bandwidth optical signal through an optical filter or a waveguide grating router (WGR). For example, a light emitting diode (LED), a superluminescent diode (SLD), a Fabry-Perot (FP) laser, a fiber amplifier light source, and an ultra-short pulse light source have been proposed, and these elements do not require the spectrum-sliced light source to employ a light source of a specific lasing wavelength as well as additional equipment for achieving wavelength stabilization.

Proposed as a spectrum-sliced light source, the LED and SLD are not expensive and also have a wide optical bandwidth. However, the LED and SLD are suitable for use as a light source for upstream signals having a lower modulation rate rather than downstream signals as they have a low modulation bandwidth and a low output power. The FP laser is a low-priced, high-output element, but has disadvantages in that it cannot provide a large number of wavelength-divided channels because of its low bandwidth, and its performance degradation due to the mode partition noise is serious when modulating and transmitting a spectrum-sliced signal at a high rate. The ultra-short pulse light source is coherent and also has a very wide light-source spectrum band, but its implementation is difficult as the lasing spectrum has low stability and its pulse width is only several picoseconds.

To address the deficiencies in the above light sources, a spectrum-sliced fiber amplifier light source has been proposed as a large number of high-power, wavelength-divided channels by spectrum-slicing ASE (Amplified Spontaneous Emission) light generated by an optical fiber amplifier. However, this light source must use an additional high-priced external modulator, such as a $LiNbO_3$ modulator, for allowing the channels to transmit data different from each other.

Another proposed light source is known as a mode-locked Fabry-Perot (FP) laser with incoherent light which produces a mode-locked signal. In order to produce the mode-locked signal, after a wide-bandwidth optical signal is generated from an incoherent light source, such as an LED or a fiber amplifier light source, through a waveguide grating router (WGR) or an optical filter, it is spectrum-sliced and then injected into an FP laser having no isolator. When a spectrum-sliced signal of a predetermined power level or more is injected into the FP laser, the FP laser generates and outputs only the light of a wavelength coinciding with the wavelength of the injected signal. Such a mode-locked FP laser with incoherent light can perform data transmission more economically by directly modulating the FP laser according to a data signal.

However, a wide-bandwidth, high-power optical signal must be injected into the FP laser in order for the FP laser to output a mode-locked signal suitable for a high-speed, long-distance transmission. Further, in the absence of controlling external temperature, the Fabry-Perot laser mode is changed to another mode when the temperature varies. This mode change causes the Fabry-Perot laser to release from the locked state, escaping from a wavelength coinciding with the wavelength of the injected spectrum-sliced signal. Thus, the mode-locked Fabry-Perot laser cannot be adapted as a WDM light source. An external temperature controller (e.g., a TEC controller) is thus indispensable to adapt such a mode-locked Fabry-Perot laser when used as a WDM light source.

FIG. 1 shows the configuration of a conventional Fabry-Perot (FP) laser having a temperature controller. As shown, the conventional FP laser includes a TEC (Thermo-Electric Cooler) controller 1, a thermistor 2, an FP laser 3, and a TEC 4. The TEC controller 1 detects the temperature of the FP laser 3 through the thermistor 2 and controls the temperature of the FP laser 3 using the TEC 4.

The conventional FP laser, however, has an increased packaging cost because the thermistor and the TEC must be coupled to the FP laser, and the need to provide an additional TEC controller further increases the overall cost. These impose a high economic burden on subscribers, so that the WDM-PON has not yet been widely accepted.

SUMMARY OF THE INVENTION

The present invention has been made to overcome the above problems and provides additional advantages, by providing a method of maintaining the mode-locked state of a Fabry-Perot laser irrespective of the temperature change and an economical WDM light source using the same method. The inventive light source and its method allow the maintenance of the mode-locked state by an external light injection irrespective of the temperature change without requiring an additional temperature controller.

In one aspect of the present invention, a method for maintaining a mode-locked state of a Fabry-Perot (FP) laser irrespective of temperature change is achieved by generating spectrum-slicing incoherent light from a light source element and injecting the spectrum-sliced light to the FP laser. Then, only a lasing mode coinciding with the injected light's wavelength is amplified and outputted. Here, a lasing-mode interval of the FP laser is set to be less than a 3 dB linewidth of the injected light, so that at least one lasing mode exists inside the 3 dB linewidth of the injected light irrespective of the changes in external temperature.

Preferably, the lasing-mode interval of the FP laser exceeds half the 3 dB linewidth of the injected light, so as to prevent two or more lasing modes from existing inside the 3 dB linewidth of the injected light. The lasing-mode interval of the FP laser can be controlled by controlling the length of a laser cavity of the FP laser.

More preferably, the injected light has a left-right asymmetric spectrum with respect to a central wavelength thereof, so as to prevent two or more lasing modes from existing inside the 3 dB linewidth of the injected light.

In another aspect of the present invention, a WDM (Wavelength Division Multiplexing) light source is provided and includes a light source element; a Fabry-Perot (FP) laser for amplifying and outputting only a lasing mode coinciding with a wavelength of light injected to the FP laser, while suppressing lasing modes not coinciding with the wavelength of the injected light; a WDM device for spectrum-slicing light generated from the light source element, for providing the spectrum-sliced light as the injected light to the FP laser, and for multiplexing a signal mode-locked by the FP laser; and a circulator for inputting the light generated from the light source element to the WDM device and outputting the signal multiplexed by the WDM device to a transmission link, wherein a lasing-mode interval of the FP laser is set to be less than a 3 dB linewidth of the injected light, so that at least one lasing mode exists inside the 3 dB linewidth of the injected light, thereby maintaining a mode-locked state of the FP laser irrespective of changes in external temperature.

Preferably, the lasing-mode interval of the FP laser exceeds half the 3 dB linewidth of the injected light, so as to prevent two or more lasing modes from existing inside the 3 dB linewidth of the injected light. The lasing-mode interval of the FP laser can be controlled by controlling the length of a laser cavity of the FP laser.

More preferably, the injected light has a left-right asymmetric spectrum with respect to a central wavelength thereof, so as to prevent two or more lasing modes from existing inside the 3 dB linewidth of the injected light.

BRIEF DESCRIPTION OF THE DRAWINGS

The above and other features and advantages of the present invention will be more clearly understood from the following detailed description taken in conjunction with the accompanying drawings, in which.

DETAILED DESCRIPTION OF THE PREFERRED EMBODIMENTS

Figure 1:
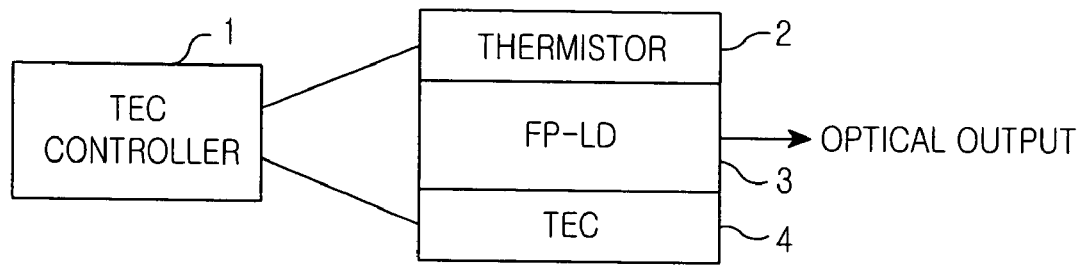
FIG. 1 shows the configuration of a conventional Fabry-Perot laser having a temperature controller.

Now, preferred embodiments of the present invention will be described in detail with reference to the annexed drawings. In the drawings, the same or similar elements are denoted by the same reference numerals even though they are depicted in different drawings. For the purposes of clarity and simplicity, a detailed description of known functions and configurations incorporated herein will be omitted as it may make the subject matter of the present invention unclear.

Figure 2:
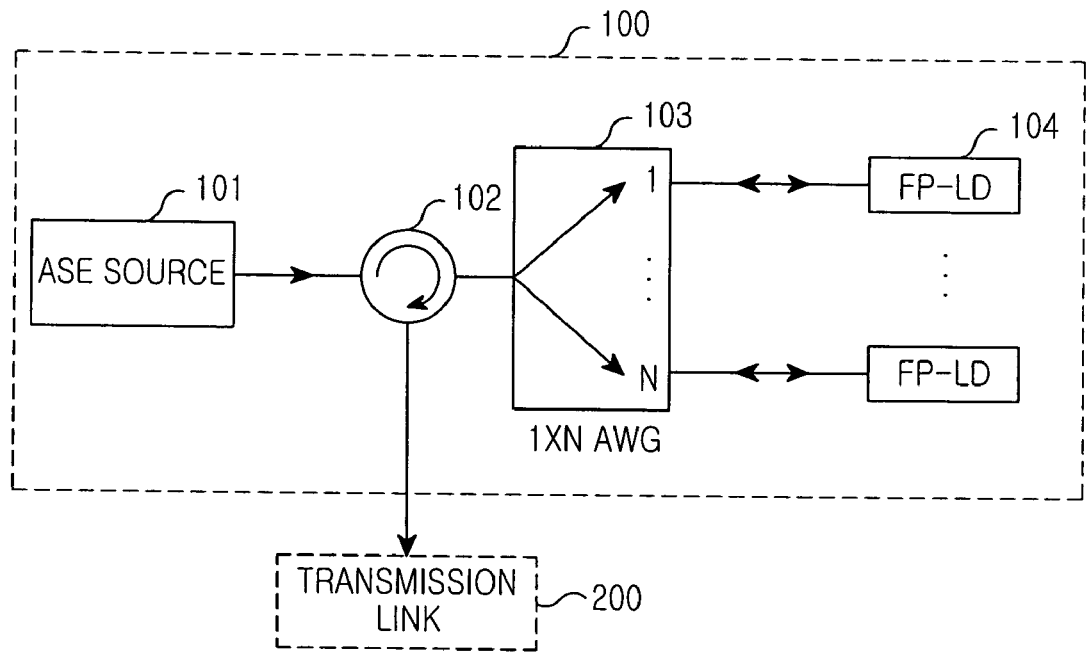
FIG. 2 shows the configuration of a WDM (Wavelength Division Multiplexing) light source employing a mode-locked Fabry-Perot (FP) laser according to a preferred embodiment of the present invention.

FIG. 2 shows the configuration of a WDM (Wavelength Division Multiplexing) light source employing a mode-locked Fabry-Perot (FP) laser according to a preferred embodiment of the present invention. The WDM light source 100 is capable of generating a wavelength-division-multiplexed optical signal to an optical transmission link 200 and includes an ASE (Amplified Spontaneous Emission) source 101, a circulator 102, an AWG (Arrayed Waveguide Grating) 103, and FP lasers 104.

As an incoherent light source having a wide linewidth, the ASE source 101 generates and outputs incoherent light to be injected into the FP lasers 104.

The circulator 102, including the first to the third ports, receives the incoherent light generated by the ASE source 101 through the first port and outputs the received light to the AWG 103 through the second port. At the same time, the circulator 102 receives WDM light mode-locked having incoherent light from the AWG 103 through the second port and outputs the received light to the transmission link 200 through the third port.

The AWG 103 is disposed between the circulator 102 and the FP lasers 104 and includes a single multiplexing port and N demultiplexing ports. The AWG 103 functions to spectrum-slice an ASE beam inputted to the multiplexing port through the second port and then output the spectrum-sliced beams to the FP lasers 104, respectively. The AWG 103 further functions to multiplex the mode-locked light beams inputted from the FP lasers 104 and then output the multiplexed beam to the circulator 102.

The FP lasers 104 are connected to the N demultiplexing ports of the AWG 103 respectively, and output light beams mode-locked in response to the incoherent beams spectrum-sliced by the AWG 103. Prior to discussing the operation of the FP laser according to the present invention in detail, a mode-locked phenomenon of a general FP laser and the related influence of external temperature changes will be described hereinafter.

Figure 3:
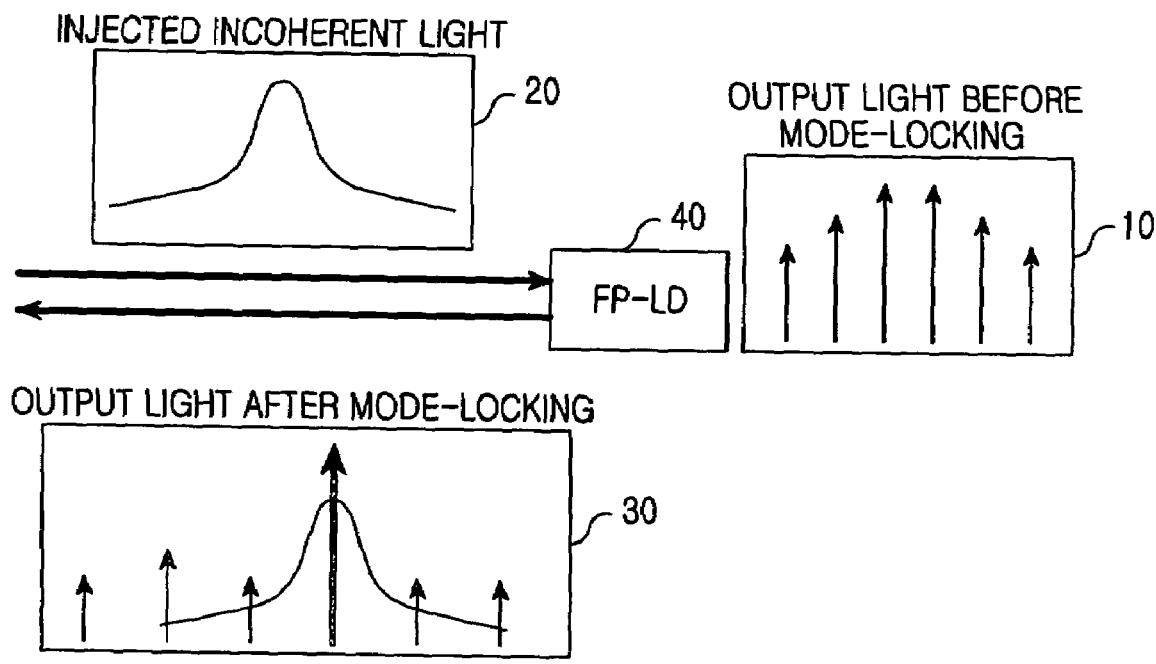
FIG. 3 illustrates a mode-locked phenomenon of a general FP laser.

FIG. 3 illustrates the mode-locked phenomenon of a general FP laser. In this drawing, "10" denotes an optical spectrum of a general FP laser 40, "20" denotes a spectrum of external incoherent light inputted to the FP laser 40, and "30" denotes an optical spectrum of the FP laser 40 when it is mode-locked in response to the inputted external incoherent light.

As shown in the optical spectrum 10 of FIG. 3, in contrast to a distributed feedback (DFB) laser which outputs a single wavelength, the FP laser 40 outputs a plurality of lasing modes arranged at intervals of a specific wavelength, centered on a single wavelength, according to the gain characteristics of the material of the laser and the resonance wavelength of a laser diode. Upon receipt of the coherent or incoherent light as shown in the spectrum 20 from the outside, the FP laser 40 amplifies and outputs only a lasing mode coinciding with the wavelength of the injected light while suppressing lasing modes not coinciding with the wavelength of the injected light, as shown in the spectrum 30.

If external temperature varies, the above FP laser releases from the mode-locked state in the case where it has no temperature control device in order to keep its operating temperature uniform. This is because the wavelength versus temperature change ratio of the FP laser is about 0.1 nm/° C., while the ratio of the AWG used for spectrum slicing of the injected light is about 0.01 nm/° C. Thus, the spectral overlap between the lasing modes of the FP laser and the injected light inevitably changes as the temperature varies.

Figure 4:
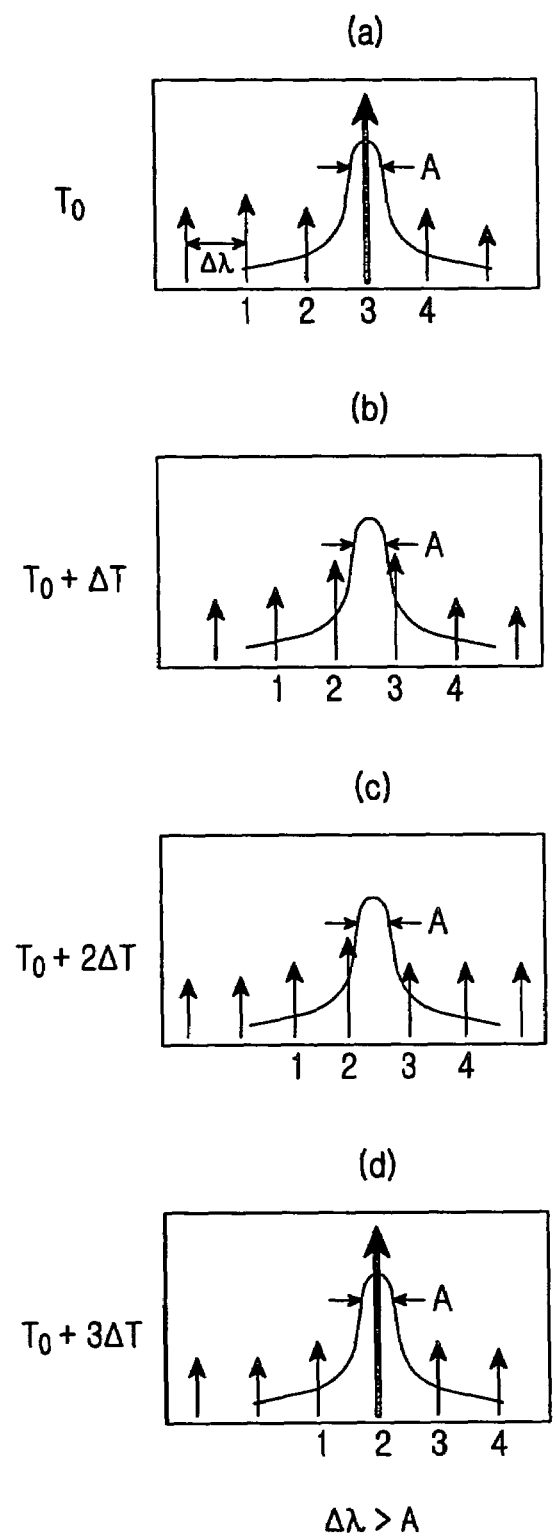
FIGS. 4a to 4d illustrate the wavelength change of the output light of the FP laser and the injected external light as peripheral temperature varies, in the case where a lasing or oscillation mode interval $\Delta\lambda$ of the FP laser is larger than a 3 dB linewidth A of the injected light.

FIGS. 4a to 4d illustrate the wavelength change of the output light of the FP laser and the injected external light as peripheral temperature varies, in the case where a lasing mode interval $\Delta\lambda$ of the FP laser is greater than the 3 dB linewidth A of the injected light. In FIG. 4a, "$T_0$" denotes the peripheral temperature, and it can be seen from FIGS. 4b to 4d that, as the temperature increases by $\Delta T$, the lasing wavelength of the FP laser is red-shifted. In FIGS. 4a and 4d, the lasing mode, existing inside the 3 dB linewidth A of the injected light, is mode-locked as denoted by a thick arrow. On the other hand, in FIGS. 4b and 4c, the lasing mode does not exist inside the 3 dB linewidth A of the injected light, where the mode-locked phenomenon disappears.

Accordingly, if it is possible to satisfy a condition in which the lasing mode of the FP laser always exists inside the 3 dB linewidth A of the injected light even though external temperature varies, the mode-locked state of the FP laser can be maintained irrespective of the temperature change. Namely, the above condition is always satisfied in the case where the mode interval $\Delta\lambda$ of the FP laser is less than the 3 dB linewidth A of the injected light.

Now, the teachings of the present invention will be explained with reference to FIGS. 5 and 6.

FIGS. 5a to 5d illustrate the wavelength change of the output light of the FP laser and the injected external light as peripheral temperature varies, in the case where the lasing mode interval $\Delta\lambda$ of the FP laser is less than the 3 dB linewidth A of the injected light. In FIG. 5a, "$T_0$" denotes the peripheral temperature, and it can be seen from FIGS. 5b to 5d that, as the temperature increases by $\Delta T$, the lasing wavelength of the FP laser is red-shifted. In all cases of FIGS. 5a to 5d, at least one lasing mode exists inside the 3 dB linewidth A of the injected light, maintaining the mode-locked state, as denoted by a thick arrow. Thus, it can be seen that these cases of FIGS. 5a to 5d are definitely different from the former cases of FIGS. 4b and 4c which have no lasing mode inside the 3 dB linewidth A of the injected light, disrupting the mode-locked phenomenon.

Figure 5:
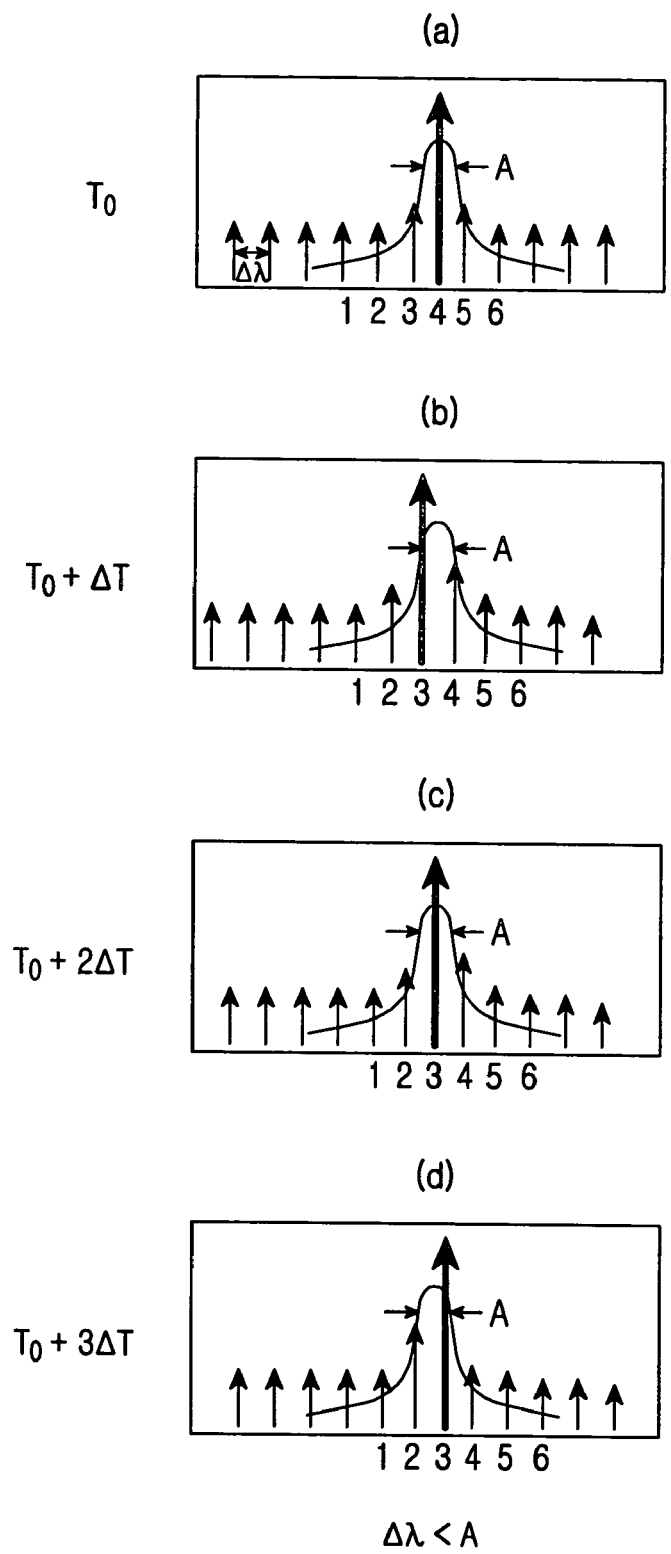
FIGS. 5a to 5d illustrate the wavelength change of the output light of the FP laser and the injected external light as the peripheral temperature varies, in the case where the lasing mode interval $\Delta\lambda$ of the FP laser is less than the 3 dB linewidth A of the injected light; and, FIGS. 6a and 6b illustrate the relationship between the lasing mode interval $\Delta\lambda$ and the cavity length of the FP laser.
Figure 6:
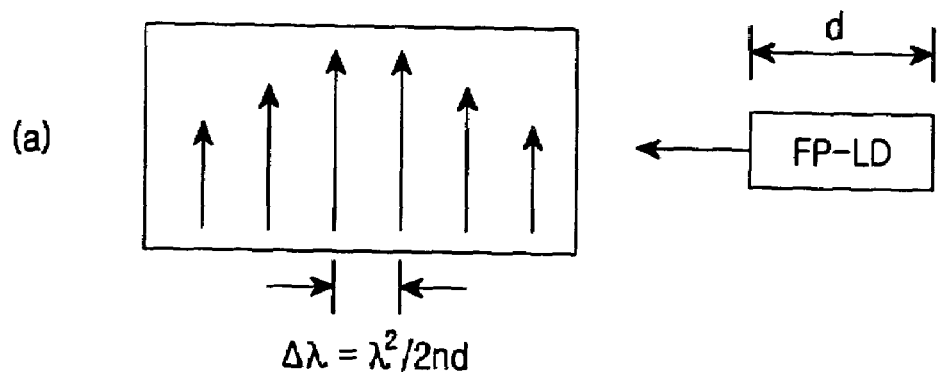
Figure 6:
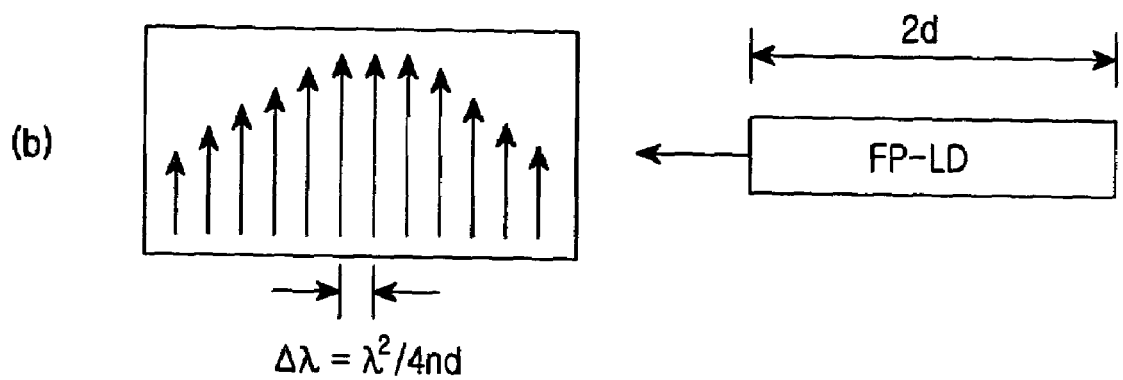

Referring to FIGS. 2 and 5, the 3 dB linewidth A of the injected light, spectrum-sliced by the arrayed waveguide grating (AWG) 103, is determined according to the characteristics of the AWG 103, and is generally about 40% of the channel interval of the AWG 103. It is thus possible to make the 3 dB linewidth A of the injected light larger than the lasing mode interval $\Delta\lambda$ of the FP laser 104 by controlling the channel interval of the AWG 103. However, it is preferable that the linewidth of the injected light is not much larger than the linewidth of the lasing mode of the FP laser in order to attain the mode-locked phenomenon effectively. Control of the 3 dB linewidth of the injected light is also restricted because the linewidth of the lasing mode of the FP laser has a relatively fixed value.

Further, the lasing mode interval $\Delta\lambda$ of the FP laser 104 varies depending on its laser cavity length. FIGS. 6a and 6b illustrate the relationship between the lasing mode interval $\Delta\lambda$ and the cavity length of the FP laser 104.

As shown in FIG. 6a, when the laser cavity length is d, the lasing mode interval $\Delta\lambda$ is expressed by the following equation:

$$\Delta\lambda = \lambda^2 / 2nd.$$

As shown in FIG. 6b, when the laser cavity length is 2d, the lasing mode interval $\Delta\lambda$ is expressed by the following equation:

$$\Delta\lambda = \lambda^2 / 4nd.$$

In these equations, $\lambda$ and n denote the wavelength and refractive index, respectively.

In other words, if the cavity length of the FP laser increases twofold, the lasing mode interval is reduced by half. In this manner, it is possible to control the lasing mode interval by changing the laser cavity length.

Meanwhile, there may be a concern that two or more lasing modes are always caught inside the 3 dB linewidth A of the injected light, in the case where the lasing mode interval $\Delta\lambda$ of the FP laser 104 is less than half the 3 dB linewidth A (e.g., when $\Delta\lambda < A/2$). Accordingly, it is preferable that the lasing mode interval $\Delta\lambda$ of the FP laser 104 is set to be more than half (A/2) of the 3 dB linewidth A of the injected light and less than the 3 dB linewidth A (i.e., $A/2 < \Delta\lambda < A$). Further, in such a particular case where two or more lasing modes exist inside the 3 dB linewidth, there is a condition in which gain competition occurs between these modes so that only one of the modes oscillates or lases. Such a condition of allowing only the single mode lasing can be accomplished more effectively in the case where the injected light has a left-right asymmetric spectrum with respect to a central wavelength thereof.

As apparent from the above description, the present invention provides a method for maintaining the mode-locked state of a Fabry-Perot laser irrespective of changes in external temperature without using a temperature controller, and a WDM light source using the same method. The present invention has an advantage in that it is possible to realize an economical and efficient WDM light source that does not require a temperature controller, and a WDM-PON using the same light source.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for maintaining a mode-locked state of a Fabry-Perot (FP) laser, the method comprising the steps of:
    a) setting a lasing-mode interval of the FP laser to be less than 3 dB linewidth of the light received therein;
    b) spectrum-slicing incoherent light generated from a light source element and injecting the spectrum-sliced light to the FP laser; and,
    c) amplifying and outputting only a lasing mode coinciding with the wavelength of the injected light by the FP laser.

2. The method as set forth in claim 1, wherein the lasing-mode interval of the FP laser exceeds half the 3 dB linewidth of the injected light, so as to prevent two or more lasing modes from existing inside the 3 dB linewidth of the injected light.

3. The method as set forth in claim 1, wherein the lasing-mode interval of the FP laser is controlled by controlling the length of a laser cavity of the FP laser.

4. The method as set forth in claim 1, wherein the injected light has a left-right asymmetric spectrum with respect to a central wavelength thereof, so as to prevent two or more lasing modes from existing inside the 3 dB linewidth of the injected light.

5. The method as set forth in claim 1, wherein the light source element includes an ASE (Amplified Spontaneous Emission) source.

6. The method as set forth in claim 1, wherein the lasing-mode interval of the FP laser is set so that at least one lasing mode exists inside the 3 dB linewidth of the injected light irrespective of changes in external temperature.

7. A WDM (Wavelength Division Multiplexing) light source comprising:
    a light source element;
    a Fabry-Perot (FP) laser for amplifying and outputting only a lasing mode coinciding with a wavelength of light injected to the FP laser, while suppressing lasing modes not coinciding with the wavelength of the injected light;
    a WDM device for spectrum-slicing light generated from the light source element, for providing the spectrum-sliced light as the injected light to the FP laser, and for multiplexing a signal mode-locked by the FP laser; and,
    a circulator for inputting the light generated from the light source element to the WDM device and outputting the signal multiplexed by the WDM device to a transmission link,
    wherein a lasing-mode interval of the FP laser is set to be less than 3 dB linewidth of the injected light, so that at least one lasing mode exists inside the 3 dB linewidth of the injected light, thereby maintaining a mode-locked state of the FP laser irrespective of changes in external temperature.

8. The WDM light source as set forth in claim 7, wherein the lasing-mode interval of the FP laser exceeds half the 3 dB linewidth of the injected light, so as to prevent two or more lasing modes from existing inside the 3 dB linewidth of the injected light.

9. The WDM light source as set forth in claim 7, wherein the lasing-mode interval of the FP laser is controlled by controlling the length of a laser cavity of the FP laser.

10. The WDM light source as set forth in claim 7, wherein the injected light has a left-right asymmetric spectrum with respect to a central wavelength thereof, so as to prevent two or more lasing modes from existing inside the 3 dB linewidth of the injected light.

11. The WDM light source as set forth in claim 7, wherein the light source element includes an incoherent light source.

12. The WDM light source as set forth in claim 11, wherein the incoherent light source includes an ASE (Amplified Spontaneous Emission) source.

13. The WDM light source as set forth in claim 7, wherein the WDM device includes a 1×N AWG (Arrayed Waveguide Grating).

* * * * *